(12) United States Patent
Cheah et al.

(10) Patent No.: US 7,400,033 B1
(45) Date of Patent: Jul. 15, 2008

(54) PACKAGE ON PACKAGE DESIGN TO IMPROVE FUNCTIONALITY AND EFFICIENCY

(75) Inventors: Bok Eng Cheah, Penang (MY); Shanggar Periaman, Penang (MY); Kooi Chi Ooi, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/648,143

(22) Filed: Dec. 29, 2006

(51) Int. Cl.
*H01L 23/02* (2006.01)
(52) U.S. Cl. .................... 257/686; 257/777
(58) Field of Classification Search .............. 257/686, 257/777, 707, 706, 714, 778, 77
See application file for complete search history.

(56) References Cited

U.S. PATENT DOCUMENTS

| 7,000,684 | B2* | 2/2006 | Kenny et al. ............ 165/80.4 |
| 7,092,254 | B1* | 8/2006 | Monsef et al. ............ 361/699 |
| 7,230,334 | B2* | 6/2007 | Andry et al. ............ 257/713 |
| 2007/0210446 | A1* | 9/2007 | Andry et al. ............ 257/714 |

* cited by examiner

*Primary Examiner*—S. V Clark
(74) *Attorney, Agent, or Firm*—Caven & Aghevli LLC

(57) ABSTRACT

Methods and apparatus to provide an improved package on package (PoP) design are described. In one embodiment, a central processing unit (CPU) package substrate and an embedded package (which may include one or more heat removal channels) are molded. Other embodiments are also described.

15 Claims, 4 Drawing Sheets

PACKAGE ON PACKAGE DESIGN TO IMPROVE FUNCTIONALITY AND EFFICIENCY

BACKGROUND

The present disclosure generally relates to the field of electronics. More particularly, an embodiment of the invention generally relates to a package on package design.

A computer system generally includes various components that may communicate with each other during operation of the computer system. Sometimes these components may be located on different dies. Hence, communication speed of these various dies may be paramount to the performance achieved by a computer system.

In some current computer systems, dies may interlink via relatively long traces through a computer system motherboard and various substrate levels. Long vertical paths may minimize the extension of current motherboard system architecture, introduce signal propagation delay, and generation of additional heat. Some current computer systems aim to reduce the length of interlinks between various dies by stacked die technology and direct silicon via technology for direct die interlink. Utilization of direct silicon via technology for stacked dies may, however, require one die to carry the power source for another die. This approach creates thermal stress on the die that is responsible for carrying the power source.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Some of the embodiments discussed herein (such as the embodiments discussed with reference to FIGS. 1-4) may utilize a package on package (PoP) design to provide efficient mechanisms for transferring data and/or power signals between a central processing unit (CPU) package and an embedded package (which may include a chipset, memory, etc.). In an embodiment, a relatively shorter CPU linkage with chipset(s) and/or memory (such as flash memory) is provided to improve functionality and/or efficiency, e.g. by increasing communication speed between various packages. Some of the embodiments discussed herein may be provided in devices or computing systems that include multiple dies, such as those discussed with reference to FIGS. 1-4.

Figure 1:
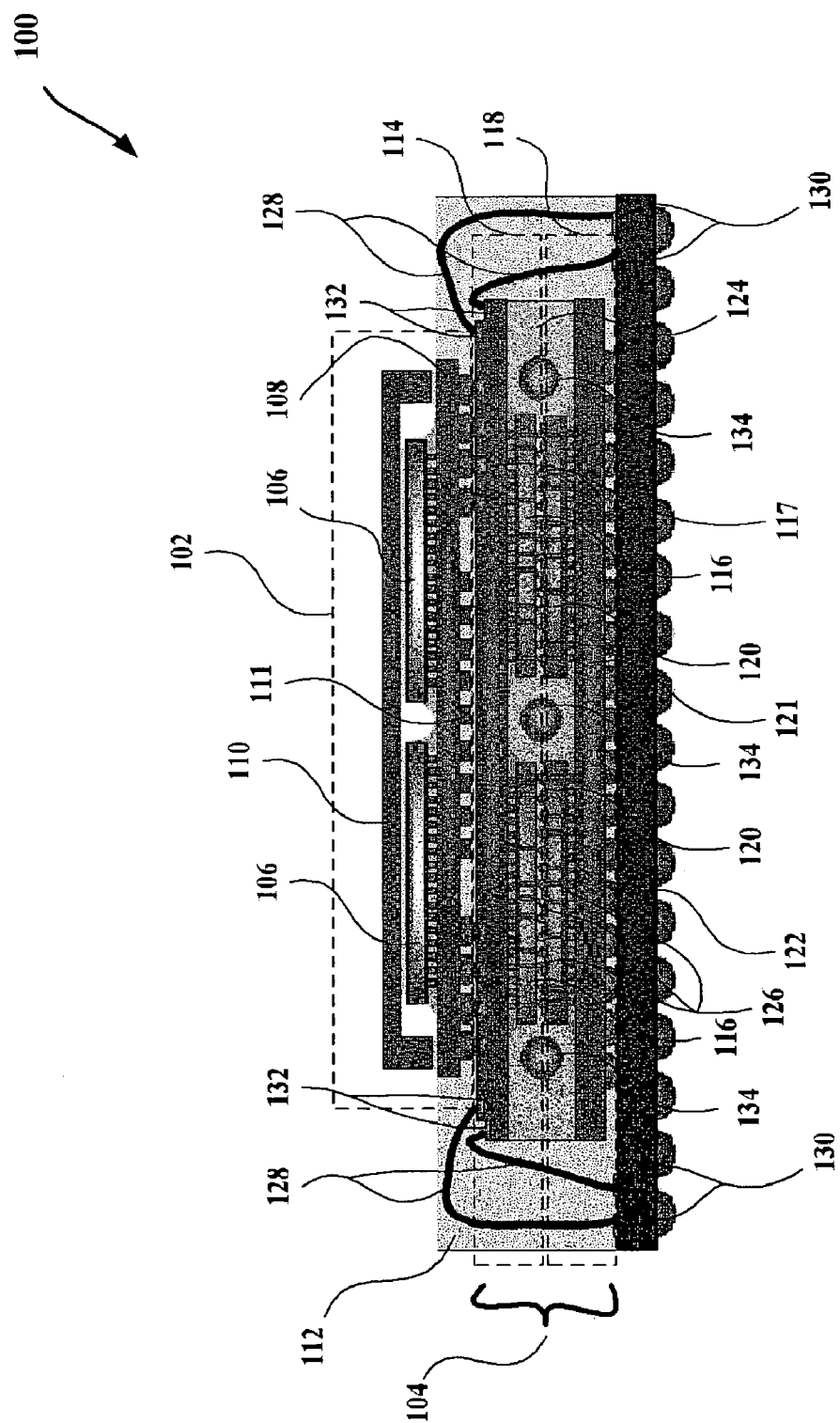
FIG. 1 illustrates a cross sectional view of a semiconductor device in accordance with an embodiment of the invention.

More particularly, FIG. 1 illustrates a cross sectional view of a semiconductor device 100 in accordance with an embodiment of the invention. The device 100 may include a CPU package 102 and an embedded package 104. The CPU package 102 may include one or more processor dies 106. In an embodiment, an integrated heat spreader (IHS) 110 may be provided to enhance dissipation of heat generated by the processor dies 106 and/or other components of the device 100. For example, the IHS 110 may be exposed to a fan (not shown) to extract heat away from components of the device 100. One or more capacitors 111 may be provided on the CPU package substrate 108.

The embedded package 104 and all or a portion of the CPU package 102 (such as the CPU package substrate 108) may be mechanically coupled through a mold 112. The embedded package 104 may include a flipped package 114 (which may include one or more chipset dies 116 mounted on a substrate 117), a bottom package 118 (which may include one or more memory dies 120 mounted on a substrate 121). As shown, the embedded package 104 may be coupled to a package substrate 122. In an embodiment, a mold 124 may be provided to mechanically couple the flipped package 114 and the bottom package 118. Moreover, at least some of the dies shown in FIG. 1 (such as dies 116 and/or 120) may include silicon vias 126. Also, one or more wire bonds 128 may electrically couple one or more pads 130 of the package substrate 122 to corresponding pads 132 of the flipped package 114. As shown in FIG. 1, in accordance with an embodiment, the pads 132 on the flipped package 114 may be staggered, e.g., to provide a better fit, increase wire bond density, etc.

Figure 2:
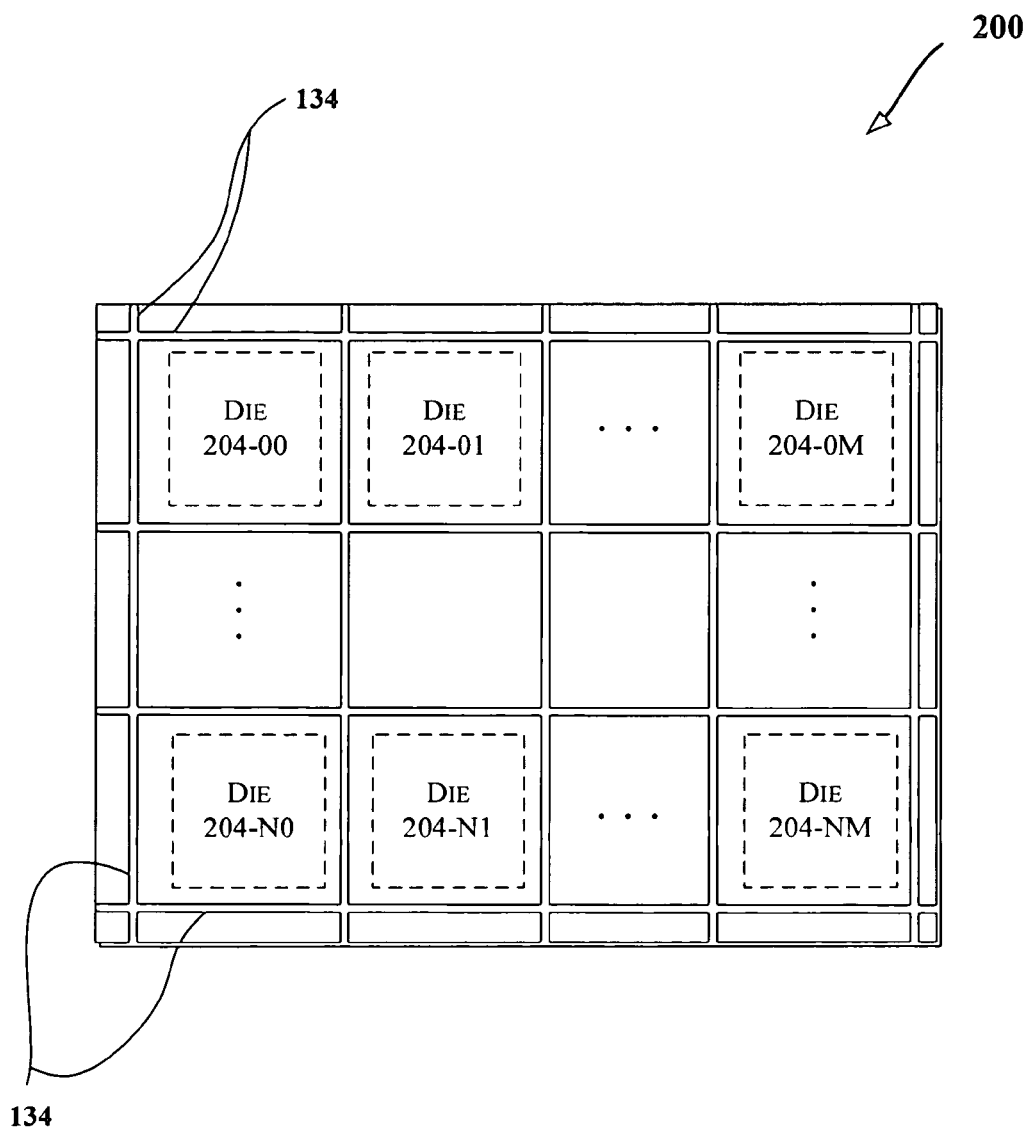
FIG. 2 illustrates a top view of a semiconductor device according to an embodiment of the invention.
Figure 3:
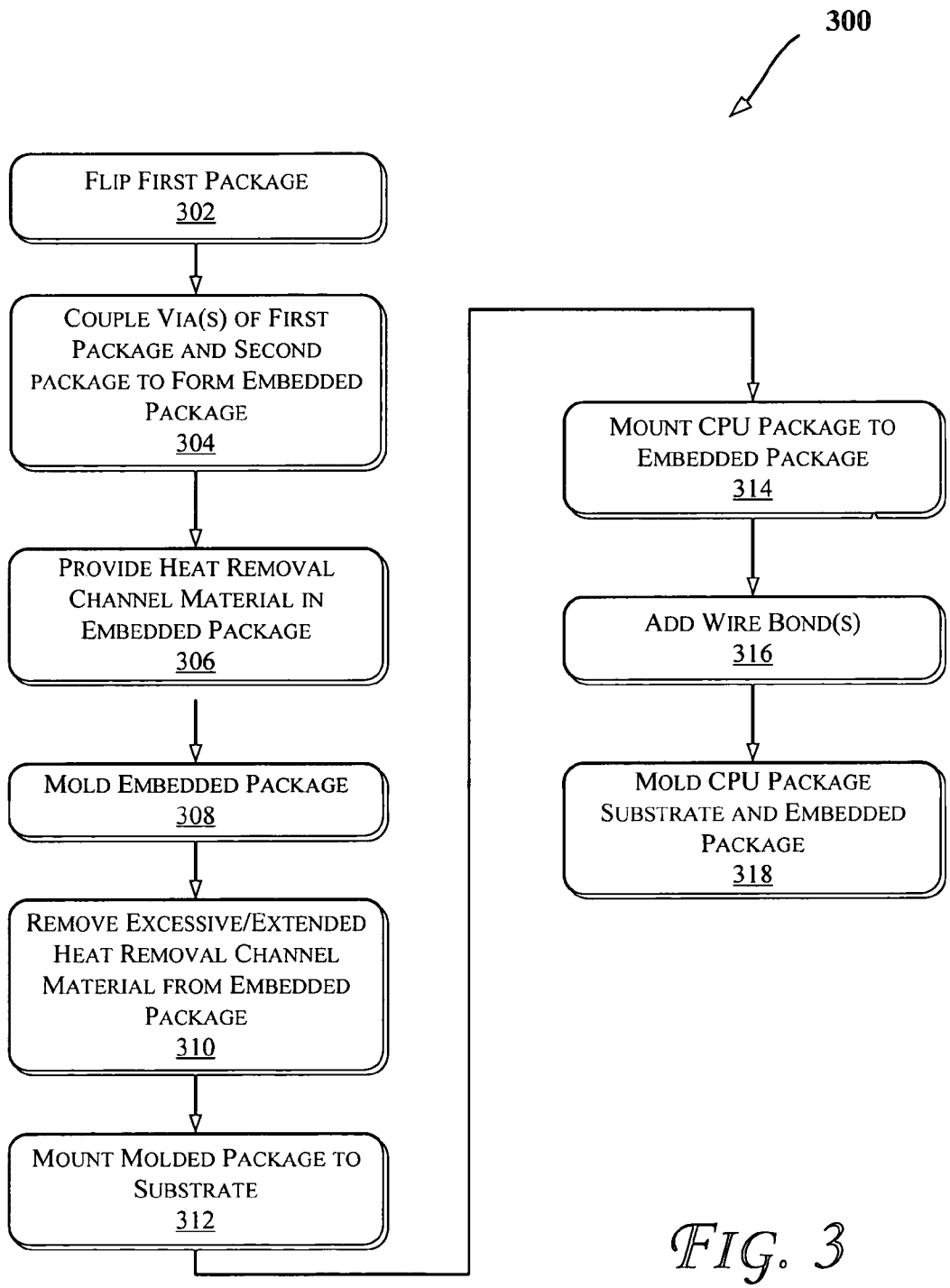
FIG. 3 illustrates a block diagram of a method according to an embodiment.

In an embodiment, the mold 124 may include one or more heat removal channels 134 to enhance heat removal from components of the device 100 such as components of the embedded package 104, as will be further discussed herein, e.g., with reference to FIGS. 2-3. Furthermore, various dies (such as dies 106, 116, and/or 120) may be coupled through one or more solder balls or combination of pins and sockets. In some embodiments, under-fill may be provided along solder ball joints (such as shown in FIG. 1) to increase mechanical stability of the joints. In an embodiment, one or more of the dies discussed herein may undergo wafer thinning process prior to assembly. In some embodiments, the molds 112 and/ or 124 may be constructed with material such as epoxy, epoxy with particles (such as silica particles), organic cylinders, plastic mold, plastic mold with particles/fiber, etc.

In an embodiment, vias 126 may be constructed with material such as aluminum, copper, silver, gold, combinations thereof, or other electrically conductive material. Moreover, each of the dies 106, 116, and/or 120 may include circuitry corresponding to various components of a computing system, such as the components discussed with reference to FIG. 4.

FIG. 2 illustrates a top view of a semiconductor device 200 in accordance with an embodiment of the invention. As shown in FIG. 2, the device 200 may include one or more dies 204-00 through 204-NM (collectively referred to herein as "dies 204"). In an embodiment, dies 204 may be the same or similar to the dies 106, 116, and/or 120 discussed with reference to FIG. 1. The device 200 may include one or more heat removal channels 134 that may be interposed between one or more of the dies 204, e.g., to enhance heat removal from components of the device 200 such as dies 204. Moreover, each of the dies 204 may include circuitry corresponding to various components of a computing system, such as the components discussed with reference to FIG. 4.

FIG. 3 illustrates a block diagram of an embodiment of a method 300 to provide a semiconductor device with a PoP design. In an embodiment, various components discussed with reference to FIGS. 1-2 and 4 may be utilized to perform one or more of the operations discussed with reference to FIG. 3. For example, the method 300 may be used to provide the devices 100 and/or 200, or one or more components of the system 400 of FIG. 4.

Referring to FIGS. 1-3, at an operation 302, a first package (e.g., package 114) may be flipped. At an operation 304, the interconnections of the first package and a second package (e.g., package 118) may be coupled to form an embedded package (e.g., package 104). At an operation 306, heat removal channel material (such as one or more meshes of fiber (e.g., carbon fiber, organic cylinder, ceramic cylinder, metal cylinder, etc.) that surround one or more dies to dissipate heat generated by the dies) may be provided in the embedded package. At an operation 308, the embedded package may be molded. At an operation 310, the excessive/extended heat removal channel material of operation 306 may be removed, e.g., to create the heat removal channels 134 discussed with reference to FIGS. 1-2. In an embodiment, the channels 134 may carry liquid, liquid composite (such as liquid with particles/fiber) or gaseous media to enhance heat removal from components of the devices 100 and/or 200.

At an operation 312, the molded embedded package (e.g., package 104) may be mounted to a package substrate (e.g., substrate 122). At an operation 314, a CPU package (e.g., package 102) may be mounted to the embedded package (e.g., package 104 which may be molded at operation 308 and mounted on the package substrate 122 at operation 312). At an operation 316, one or more wire bonds (e.g., wire bonds 128) may be added. In various operations, the order of operations 304-316 may be interchangeable. At an operation 318, one or more portions of the CPU package such as its substrate (e.g., package substrate 108) may be molded to the embedded package (e.g., through the mold 112).

In some embodiments, the minimized vertical path in package and/or socket provided through the techniques discussed with reference to FIGS. 1-3 may allow for the extension of motherboard system architecture. Also, some of the embodiments may result in the floor space on the motherboard being optimized and/or improvement to I/O density through silicon via, wire bonding, and/or controlled collapse chip connection (C4) interconnections. Also, wire bond and C4 interconnects may enable additional electrical connections to supply different voltage level for CPUs, Netcom processors (such as processors that process data communicated over a network such as the network 403 of FIG. 4), chipset(s), and/or memory. Further, additional interconnections may be provided between CPUs and external Netcom processors through wire bonds 128. Embedded package 104 may provide direct communication between chipsets (e.g., dies 116) and memory (e.g., dies 120) or external board processors through silicon vias. Hence, in an embodiment, CPUs, Netcom processors, chipsets, and/or memory may be integrated into a single package such as device 100 of FIG. 1 or device 200 of FIG. 2.

Figure 4:
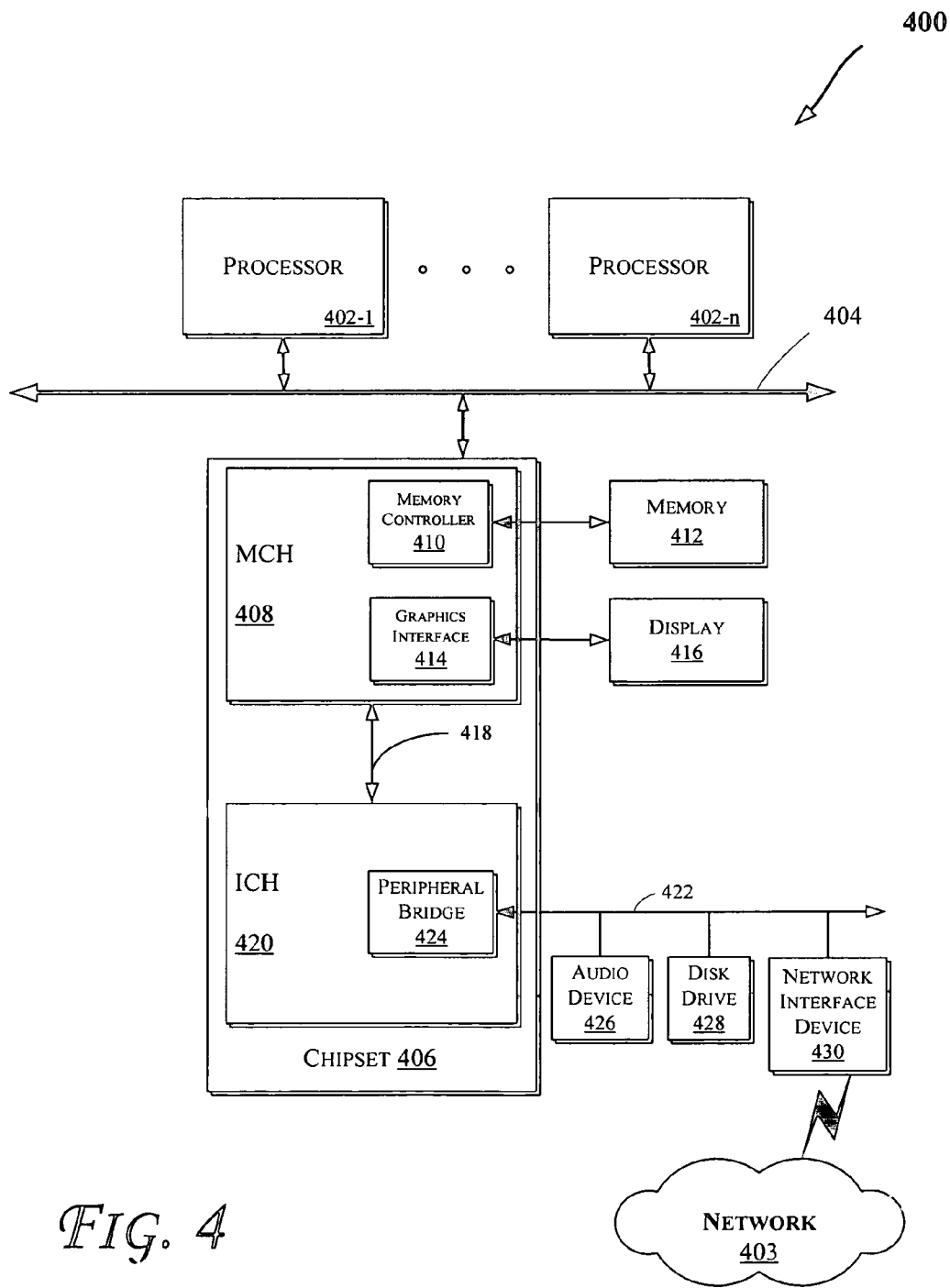
FIG. 4 illustrates a block diagram of a computing system, which may be utilized to implement various embodiments discussed herein.

FIG. 4 illustrates a block diagram of a computing system 400 in accordance with an embodiment of the invention. The computing system 400 may include one or more central processing unit(s) (CPUs) 402 or processors that communicate via an interconnection network (or bus) 404. The processors 402 may include a general purpose processor, a network processor (that processes data communicated over a computer network 403), or other types of a processor (including a reduced instruction set computer (RISC) processor or a complex instruction set computer (CISC)). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors. Moreover, the operations discussed with reference to FIGS. 1-3 may be performed by one or more components of the system 400.

A chipset 406 may also communicate with the interconnection network 404. The chipset 406 may include a memory control hub (MCH) 408. The MCH 408 may include a memory controller 410 that communicates with a memory 412. The memory 412 may store data, including sequences of instructions that are executed by the CPU 402, or any other device included in the computing system 400. In one embodiment of the invention, the memory 412 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 404, such as multiple CPUs and/or multiple system memories.

The MCH 408 may also include a graphics interface 414 that communicates with a display 416. In one embodiment of the invention, the graphics interface 414 may communicate with the display 416 via an accelerated graphics port (AGP). In an embodiment of the invention, the display 416 may be a flat panel display that communicates with the graphics interface 414 through, for example, a signal converter that translates a digital representation of an image stored in a storage device such as video memory or system memory into display signals that are interpreted and displayed by the display 416. The display signals produced by the interface 414 may pass through various control devices before being interpreted by and subsequently displayed on the display 416.

A hub interface 418 may allow the MCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments of the invention, integrated drive electronics (IDE) or small computer system interface (SCSI)

hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403). Other devices may communicate via the bus 422. Also, various components (such as the network interface device 430) may communicate with the MCH 408 in some embodiments of the invention. In addition, the processor 402 and the MCH 408 may be combined to form a single chip. Furthermore, the graphics accelerator 416 may be included within the MCH 408 in other embodiments of the invention.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 400 may be arranged in a point-to-point (PtP) configuration. For example, processors, memory, and/or input/output devices may be interconnected by a number of point-to-point interfaces.

In various embodiments of the invention, the operations discussed herein, e.g., with reference to FIGS. 1-4, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIGS. 1-4.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
   a central processing unit (CPU) package substrate;
   a semiconductor package comprising a chipset die and a memory die incorporated in a first mold material to form an embedded package, wherein the embedded package is coupled to the CPU package substrate on a first side of the embedded package, the embedded package to comprise one or more heat removal channels; and
   a second mold material to mechanically couple the CPU package substrate to the embedded package and at least partially encapsulate the CPU package substrate and the embedded package.

2. The apparatus of claim 1, wherein the embedded package comprises one or more of a flipped package and a bottom package, wherein a top side of the flipped package is coupled to a top side of the bottom package and the flipped package is coupled to the CPU package substrate on the first side of the embedded package.

3. The apparatus of claim 2, wherein the flipped package, the bottom package, and a package substrate are molded together.

4. The apparatus of claim 2, wherein the flipped package comprises a chipset die.

5. The apparatus of claim 2, wherein the bottom package comprises a memory die.

6. The apparatus of claim 2, further comprising one or more wire bonds to electrically couple one or more pads of a package substrate, coupled to the embedded package on a second side of the embedded package opposite from the first side, to corresponding pads of the flipped package.

7. The apparatus of claim 6, wherein the pads on each side of the flipped package are staggered.

8. The apparatus of claim 1, further comprising one or more processor dies coupled to a same side of the CPU package substrate.

9. The apparatus of claim 1, further comprising one or more vias to electrically couple the CPU package substrate to one or more pads of the embedded package.

10. The apparatus of claim 1, wherein the mold material comprises one or more heat removal channels.

11. A method comprising:
    electrically coupling one or more vias of a first package and a second package, wherein the first package and second package are coupled in a first mold material to form an embedded package;
    forming heat removal channels in the embedded package;
    molding the embedded package in a second mold material; and
    mounting a central processing unit (CPU) package to the molded embedded package.

12. The method of claim 11, further comprising molding a substrate of the CPU package and the embedded package.

13. The method of claim 11, further comprising adding one or more wire bonds to electrically couple a substrate of the embedded package to the embedded package.

14. The method of claim 11, further comprising flipping at least one of the first package or the second package prior to coupling the one or more vias.

15. The method of claim 11, further comprising mounting the molded embedded package on a package substrate.

* * * * *